United States Patent [19]

Shinohara et al.

[11] Patent Number: 5,383,132
[45] Date of Patent: Jan. 17, 1995

[54] DESIGN VERIFICATION DEVICE

[75] Inventors: Hirofumi Shinohara; Yoshiki Tsujihashi; Hisashi Matsumoto, all of Hyogo, Japan

[73] Assignee: Mitsubishi Denki Kabushiki Kaisha, Tokyo, Japan

[21] Appl. No.: 894,663

[22] Filed: Jun. 5, 1992

[30] Foreign Application Priority Data

Oct. 30, 1991 [JP] Japan .................. 3-285109

[51] Int. Cl.[6] .................. G06F 15/60; G06F 15/40
[52] U.S. Cl. .................................. 364/491; 364/488
[58] Field of Search ................ 364/488, 489, 490, 491

[56] References Cited

U.S. PATENT DOCUMENTS

| | | | |
|---|---|---|---|
| 4,791,586 | 12/1988 | Maeda et al. | 364/491 |
| 4,829,446 | 5/1989 | Draney | 364/488 |
| 5,008,553 | 4/1991 | Abe | 250/492.2 |
| 5,019,997 | 5/1991 | Haller | 364/488 |
| 5,062,054 | 10/1991 | Kawakami et al. | 364/491 |
| 5,140,402 | 8/1991 | Murakata | 357/45 |
| 5,191,542 | 3/1993 | Murofushi | 364/491 |

OTHER PUBLICATIONS

"Physical Design and Verification Reference Manual, Version 2.0", SDA Systems, Inc., Jun. 22, 1988.

*Primary Examiner*—Kevin J. Teska
*Assistant Examiner*—Susan Wieland
*Attorney, Agent, or Firm*—Lowe, Price, LeBlanc & Becker

[57] ABSTRACT

A design verification device includes a diagram data memory for storing designed diagram data, a design reference value memory for storing a design reference value, a determination circuit for making determination with different weight between intersecting directions of a diagram to either the distance or the design reference value in calculating the distance between diagram data provided from the diagram data memory means for making determination whether the calculated distance follows the design reference value; and an error signal output circuit for providing an error signal when determination is made that the design reference value is not followed by the determination circuit.

8 Claims, 7 Drawing Sheets

DESIGN VERIFICATION DEVICE

BACKGROUND OF THE INVENTION

1. Field of the Invention

The present invention relates to a design verification device in the plan design drawing of, for example, a semiconductor integrated circuit, to calculate the distance between the designed diagram data for automatically verifying whether the design is carried out according to previously set design reference values.

2. Description of the Background Art

Figure 1:
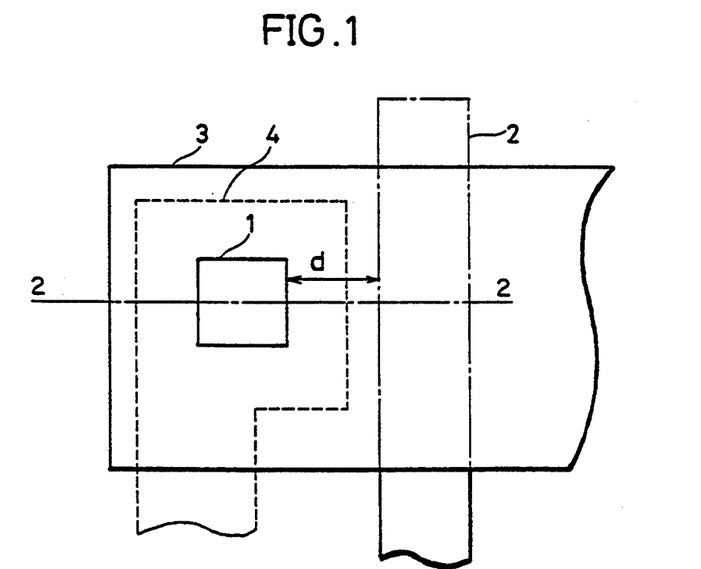
FIG. 1 is a plan view showing diagram data in a plan design drawing of a semiconductor integrated circuit.
Figure 2:
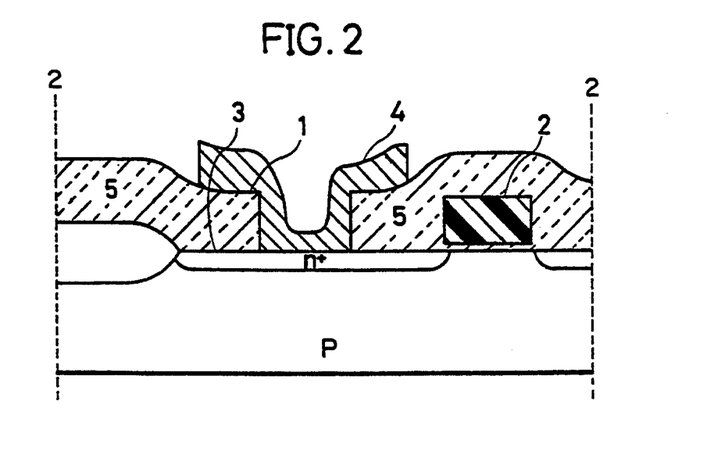
FIG. 2 is a sectional view of the semiconductor integrated circuit of FIG. 1 taking along line A—A.

FIG. 1 is a plan view showing diagram data in the plan design drawing of a semiconductor integrated circuit. FIG. 2 is a sectional view of the semiconductor integrated circuit of FIG. 1 taken along line 2—2. Referring to FIGS. 1 and 2, a contact hole 1 is formed in an insulation film 5 to make contact with an n+ diffusion region 3. An Al interconnection 4 is formed in contact hole 1. The drain of the MOS transistor having a channel formed in the overlapping region of n+ diffusion region 3 and Al interconnection 4 is connected to Al interconnection 4 through contact hole 1. A gate polysilicon 2 is formed between adjacent n diffusion regions 3.

It can be seen from FIG. 2 that gate polysilicon 2 is separated from Al interconnection 4 by insulation film 5. FIG. 2 shows the normal case where there is no positioning offset of gate polysilicon 2 in the photolithodiaphic process of printing the pattern of contact hole 1 in an Si substrate.

Figure 3:
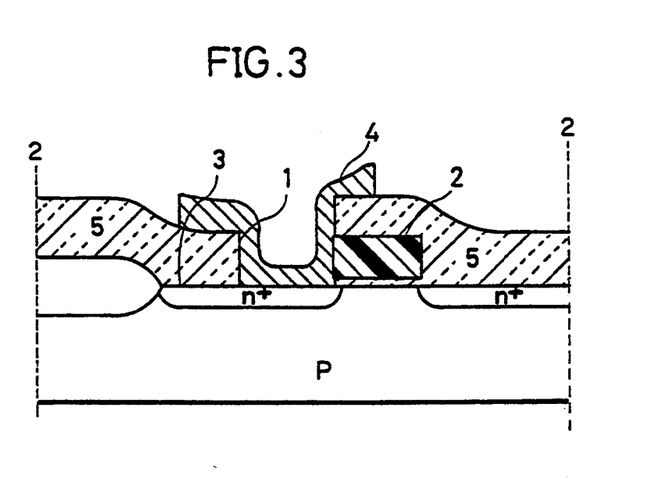
FIG. 3 is a sectional view of a semiconductor integrated circuit where there is positioning offset.

FIG. 3 shows the case where there is positioning offset of gate polysilicon 2. Such a positioning offset causes shorting to occur between Al interconnection 4 and gate polysilicon 2.

In order to prevent shorting caused by positioning offset, the distance d (shown in FIG. 1) between contact hole 1 and gate polysilicon 2 is set as a design reference value previously in the stage of designing to design a circuit pattern diagram.

A design verification device has been developed having a program that automatically checks by computing whether the design reference is satisfied in all the design drawings. Such a design verification device is called DRC (Design Rule Check).

Figure 4:
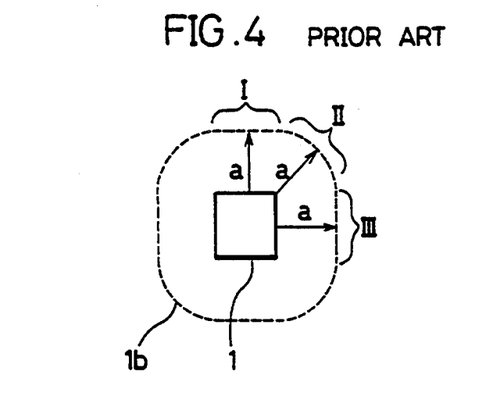
FIG. 4 is a plan view of an error determination boundary joining points having a distance of a according to a conventional method of design rule checking.

FIG. 4 is a plan view showing an error determination boundary according to a conventional design rule check method. Referring to FIG. 4, an error determination boundary 1b is a virtual diagram joining points having a distance of a from contact hole 1. Error determination boundary 1b is enclosed with straight lines of I and III which are the parallel displacement of the top and bottom sides and the left and right sides of contact hole 1 by the distance of a, and with a corner portion II which is a circular arc having a radius of a where the vertex of the corner portion of contact hole 1 is the center point.

Figure 5:
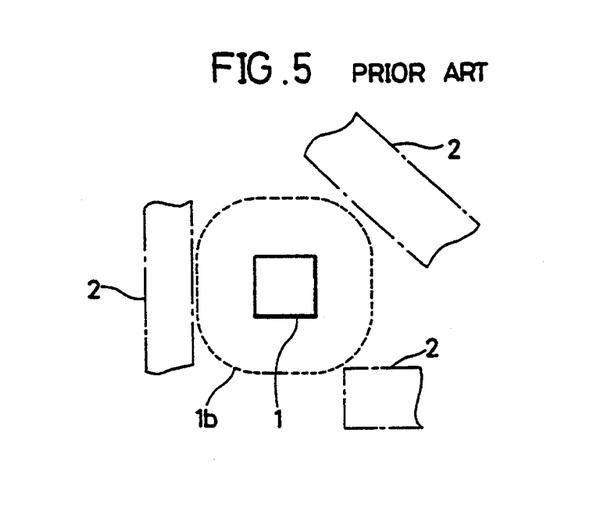
FIG. 5 is a plan view showing an example of a diagram data where determination is made of no error based on the error determination boundary of FIG. 4.

FIG. 5 is a plan view showing an example of a diagram data in which determination is made of no error with respect to error determination boundary 1b. Determination is made of no error if the diagram of gate polysilicon 2 does not transgress error determination boundary 1b, as in the case of the three gate polysilicons 2 of FIG. 5.

Figure 6:
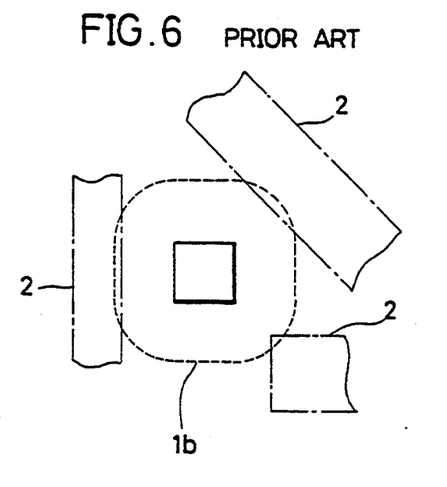
FIG. 6 is a plan view showing an example of a diagram data where determination is made of an error based on the error determination boundary of FIG. 4.

FIG. 6 is a plan view showing an example of a diagram data where determination is made of an error with respect to the error determination boundary 1b of FIG. 4. It can be seen from FIG. 6 that gate polysilicon 2 transgresses the error determination boundary 1b, resulting in the determination of an error.

Figure 7:
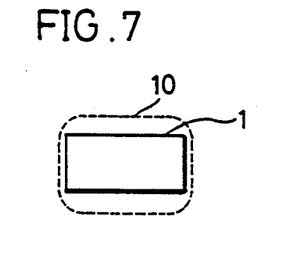
FIG. 7 is a plan view showing an offset between a design plan pattern and a completed plan pattern.

FIG. 7 is a plan view showing the offset between a completed plan pattern and the design plan pattern. Referring to the design plan pattern of a rectangular contact hole 1 of FIG. 7, the plan pattern comes nearer to a circle with the width of the longer side broadened due to a slight blur of image of the optical system in photolithography or difference in the etching rate, whereby the completed plan pattern 10 is enlarged towards the longer side.

It is necessary to set the design reference value of the longer side to be larger than that of the shorter side in order to carry out design reference checking taking into consideration the actual configuration of the product after manufacturing.

Figure 8:
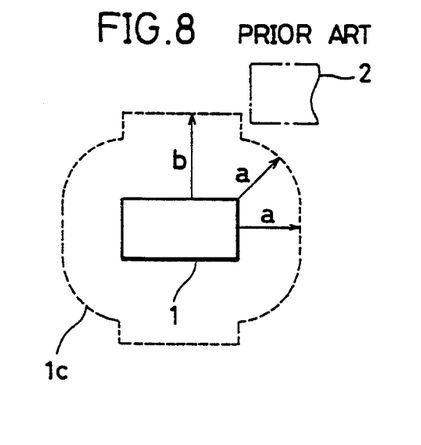
FIG. 8 is a plan view showing an example of an error determination boundary according to a conventional method of checking with different design reference values for the respective sides.
Figure 9:
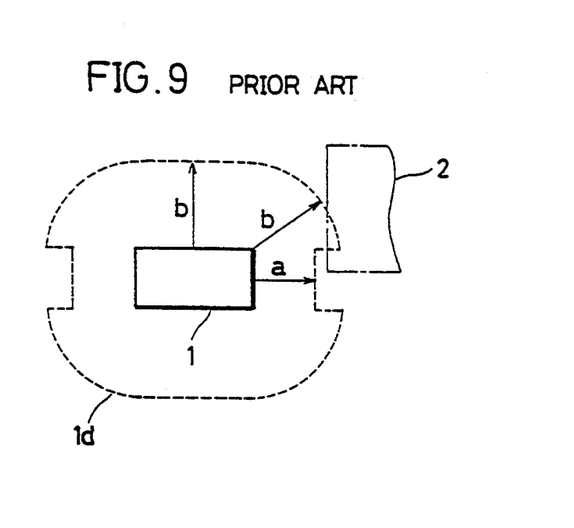
FIG. 9 is a plan view showing an example of another error determination boundary according to a conventional method of checking with different design reference values for respective sides.

A conventional method of design rule checking in shown in FIGS. 8 and 9 where the design reference value differs between the long side and the short side.

In the checking method of FIG. 8, the error determination boundary is provided with design reference value "b" for the long side, design reference value "a" for the short side, and a circular arc of radius "a" for the corner portion. In this case, an error can not be detected even if there is a gate polysilicon 2 that should be determined as an error.

FIG. 9 shows an error determination boundary where a circular arc of not radius "a" which is the design reference value for the short side, but of radius "b" which is the design reference value for the long side, is employed for the corner portion. In this case, determination is made of an error which should really be not.

Thus, there were cases where erroneous determination was made, as described in the foregoing, when different design reference values were set for the direction of the x axis and the y axis in the conventional method of design rule checking.

SUMMARY OF THE INVENTION

An object of the present invention is to provide a design verification device that can carry out design reference checking of high precision that closely conforms to the actual manufactured configuration of a product such as a semiconductor integrated circuit.

A design verification device according to the present invention to calculate the distance between designed diagram data for making determination whether the design is carried out according to a previously set reference value, comprises: a diagram data memory for storing designed diagram data; a design reference value memory for storing design reference values; a determination circuit for making determination with different weight given between intersecting direction of a diagram to either the distance or the design reference value in calculating the distance between diagram data provided from the diagram data memory for making determination whether the calculated distance conforms to the design reference value; and an error signal output circuit for providing an error signal when determination is made by the determination circuit that the design reference value is not followed.

The diagram data of the present invention may be two-dimensional or three-dimensional diagram data.

The intersecting directions on the diagram where different weight are given in the present invention are, for example, orthogonal. In the case of two-dimensional diagram data, different weight are given in the x axis direction and the y axis direction. In the case of three-dimensional diagram data, different weight are given in the x axis direction, the y axis direction, and the z axis direction.

In the corner portion where the sides join, either the distance or the design reference value is employed for an elliptical arc to set an error determination boundary.

In the corner portion where the faces join, either the distance or the design reference value is employed for an elliptical curved surface to set an error determination boundary.

According to the present invention, a smooth diagram can be obtained for the virtual diagram of an error determination boundary to allow design reference checking of high precision corresponding to the actual manufactured configuration of a product.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 10:
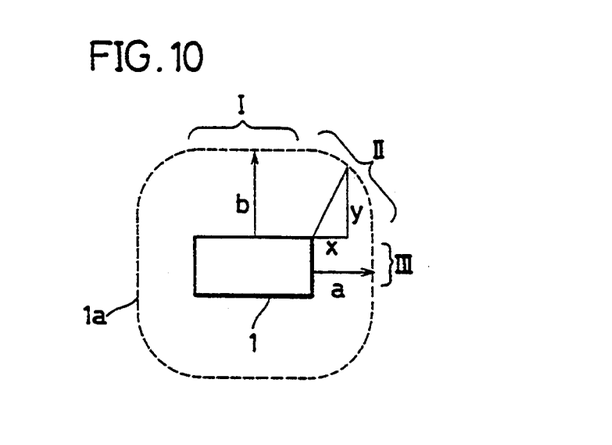
FIG. 10 is a plan view showing an example of an error determination boundary according to a method of checking of the present invention.

FIG. 10 is a plan view showing an example of an error determination boundary according to a checking method of the present invention. Referring to FIG. 10, an error determination boundary 1a is set in the periphery of a contact hole 1. The top and bottom sides I of error determination boundary 1a is formed by a line segment at a distance of "b" from the top and bottom sides of contact hole 1. The left and right sides III is formed of a line segment at a distance of "a" from the left and right sides of contact hole 1. The corner II is formed of an elliptical arc that is expressed by the following equation with the vertex of the corner of contact hole 1 as the center.

$$\left(\frac{x}{a}\right)^2 + \left(\frac{y}{b}\right)^2 = 1$$

In FIG. 10, a weight of 1/a is given in the horizontal direction, and a weight of 1/b is given in the vertical direction as the determination references.

Figure 11:
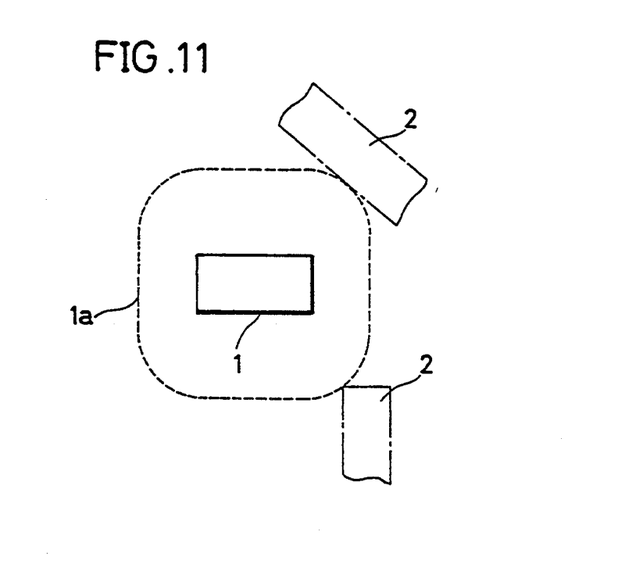
FIG. 11 is a plan view showing an example of diagram data where determination is made of no error according to the error determination boundary of FIG. 10 of the present invention.

FIG. 11 is a plan view showing an example of diagram data where determination is made of no error with respect to the error determination boundary of FIG. 10 according to the present invention. Referring to FIG. 11, determination is made of no error if gate polysilicon 2 does not transgress error determination boundary 1a.

Figure 12:
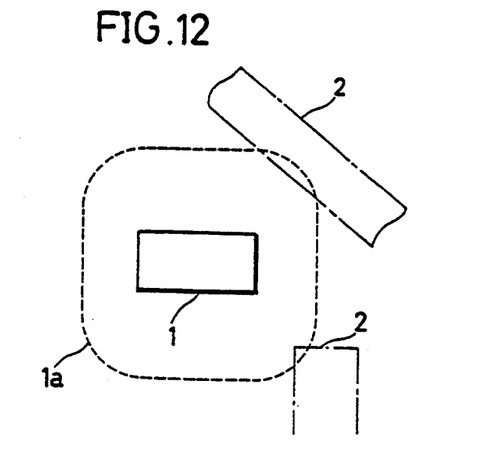
FIG. 12 is a plan view showing an example of diagram data where determination is made of an error according to the error determination boundary of FIG. 10 of the present invention.

FIG. 12 is a plan view of diagram data showing the case where determination is made of an error with respect to the error determination boundary of FIG. 10 according to the present invention. Referring to FIG. 12, determination is made of an error if gate polysilicon 2 transgresses error determination boundary 1a.

Figure 13:
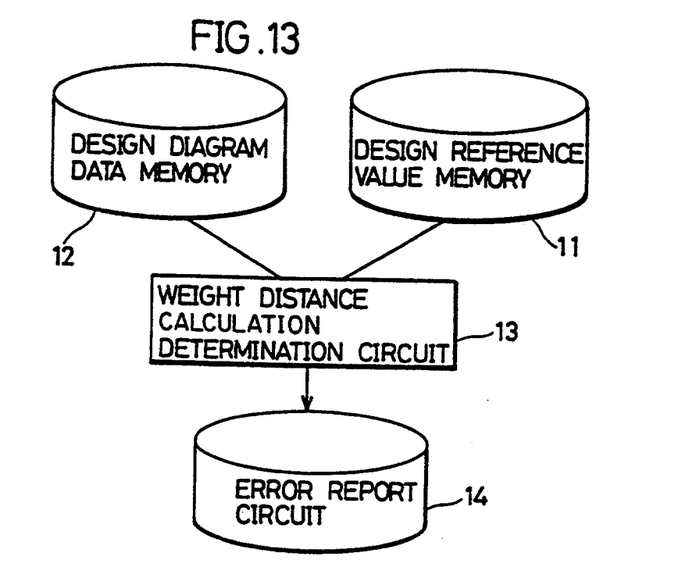
FIG. 13 is a system structure diagram of the design verification device according to the present invention.

FIG. 13 is a system structure diagram of a design verification device according to the present invention. Referring to FIG. 13, a weight distance calculation determination circuit 13 has a design reference value provided from a design reference value memory 11, and designed diagram data provided from a design diagram data memory 12. In weight distance calculation determination circuit 13, different weights are given to the distance in direction perpendicular to each other, for example, whereby the distance between diagram data is calculated to make determination whether the diagram data conform to the design reference value. In the case where determination is made that there is an error, an error signal is emitted from an error report circuit 14. Also, the error generation location is provided to the error report circuit. An error signal is not emitted from error report circuit 14 if there is no error.

The calculation method of making determination whether the diagram data transgresses the error determination boundary or not will be described hereinafter.

Figure 14:
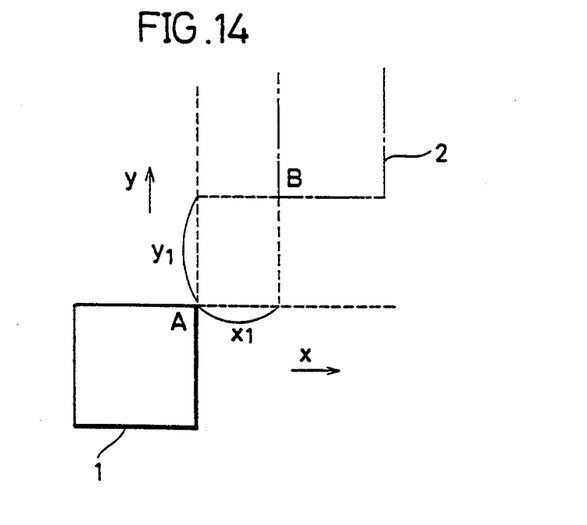
FIG. 14 is a plan view of diagram data showing an example of a method of calculation for making determination whether the corner of the diagram data transgresses that of the error determination boundary.

FIG. 14 is a plan view of diagram data showing an example of the method of making determination whether the corner of the diagram data transgresses the corner of the error determination boundary. Referring to vertex A of contact hole 1 and vertex B of gate polysilicon 2 in FIG. 14, the abscissa value is $x_1$ and the ordinate value is $y_1$. If the following equation:

$$\sqrt{\left(\frac{x_1}{a}\right)^2 + \left(\frac{y_1}{b}\right)^2} \geqq 1$$

is satisfied, determination is made that there is no error since vertex B is outside the error determination boundary.

If $$\sqrt{\left(\frac{x_1}{a}\right)^2 + \left(\frac{y_1}{b}\right)^2} < 1$$

determination is made that there is an error since vertex B is inside the error determination boundary.

With a weight of 1/a for the distance in the abscissa direction and a weight of 1/b for the distance in the ordinate direction, the above method makes determination according to whether the distance between vertexes A and B is above or less than 1.

The method of making determination whether the diagram data transgresses the error determination boundary or not will be described hereinafter in the case where the edge of gate polysilicon 2 exists within the corner portion of contact hole 1.

Figure 15:
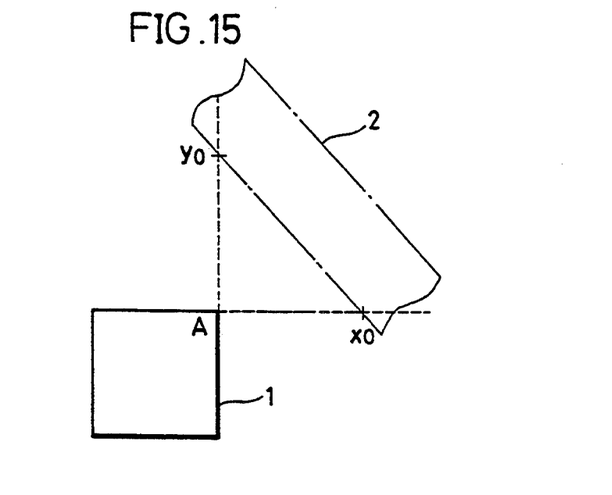
FIG. 15 is a plan view of a diagram data showing an example of a calculation method for making determination whether the side of the diagram data transgresses the corner of the error determination boundary.

FIG. 15 is a plan view of a diagram data showing an example of a calculation method of making determination whether the side of a diagram data transgresses the corner portion of an error determination boundary. Referring to vertex A of contact hole 1 and the side of gate polysilicon 2 in FIG. 15, the abscissa value, i.e. the distance from vertex A to the intersection of the side of gate polysilicon 2 and the x axis, is designated $x_O$, and the ordinate value, i.e. the distance from vertex A to the intersection of the side of gate 2 and the y axis, is designated $y_O$.

If the following equation:

$$\frac{\frac{x_O}{a} \cdot \frac{y_O}{b}}{\sqrt{\left(\frac{x_O}{a}\right)^2 + \left(\frac{y_O}{b}\right)^2}} \geqq 1$$

is satisfied, determination is made that there is no error since gate polysilicon 2 is outside the error determination boundary.

If $$\frac{\frac{x_O}{a} \cdot \frac{y_O}{b}}{\sqrt{\left(\frac{x_O}{a}\right)^2 + \left(\frac{y_O}{b}\right)^2}} < 1$$

determination is made that there is an error since gate polysilicon 2 is inside the error determination boundary.

The above calculation method makes determination with a weight of 1/a for the distance in the direction of the abscissa, and a weight of 1/b for the distance in the direction of the ordinate.

Figure 16:
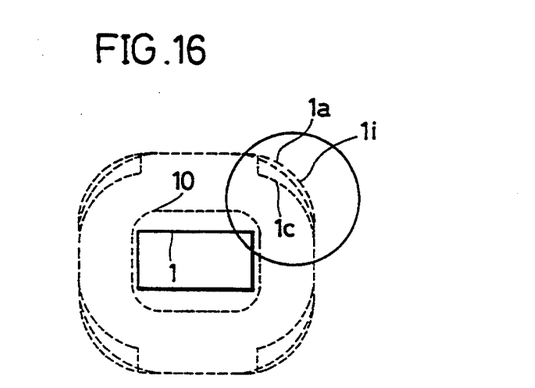
FIG. 16 is a plan view of diagram data showing an error determination boundary according to an embodiment of the present invention and an error determination boundary according to a conventional method in comparison with an ideal error determination boundary.

FIG. 16 is a plan view of showing the error determination boundaries according to an embodiment of the present invention and according to a conventional method in comparison with an ideal error determination boundary. Referring to FIG. 16, an error determination boundary 1a according to an embodiment of the present invention, an error determination boundary 1c according to a conventional method, and an ideal error determination boundary 1i are indicated around completed plan pattern 10 in the periphery of contact hole 1.

Figure 17:
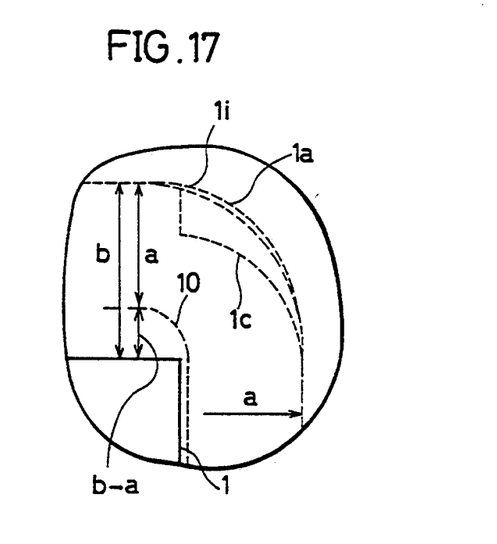
FIG. 17 is a partial enlarged plan view of FIG. 16.

FIG. 17 is a partial enlarged plan view of FIG. 16. It can be appreciated from FIG. 17 that error determination boundary 1a according to the embodiment of the present invention approximates more to the ideal error determination boundary 1i then the error determination boundary 1c according to a conventional method. Thus, the present invention allows a more ideal design reference checking.

Although the above embodiment was described where verification was carried out of diagram data between contact hole 1 and gate polysilicon 2, the design verification device of the present invention is not limited to the embodiments described. Verification of a distance can be carried out not only for separated diagrams, but also for diagrams of comprehended relationship such as between contact 1 and n+ diffusion region 3, or between contact hole 1 and Al interconnection 4 in FIG. 1, for example. The present invention may also be applied to verification of distances between diagram of repetitive units such as the distance between contact holes in adjacent regions.

Although the above embodiment has been described taking a semiconductor integrated circuit as an example, the present invention may be applied to those having multilayered structure such as a printed circuit board.

Although a diagram of two dimension is taking as an example in the above described embodiments, the present invention may be applied for three dimensional diagram data. In this case, a weight of 1/a in the x axis direction, a weight of 1/b in the y axis direction, and a weight of 1/c of the z axis direction may be given, with an error determination boundary set including an elliptical curved surface of:

$$\left(\frac{x_1}{a}\right)^2 + \left(\frac{y_1}{b}\right)^2 + \left(\frac{z_1}{c}\right)^2 = 1$$

in the proximity of the vertex.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A design verification device for making determination whether the design is carried out according to a previously set design reference value by calculating the distance of a straight line between boundaries of design diagram data in a physical space, said design verification device comprising:

diagram data memory means for storing design diagram data, design reference value memory means for storing design reference values, determination means for making determination whether said distance conforms to the corresponding design reference value with different weight given to different intersecting directions in calculating the distance of the straight line between boundaries of design diagram data, and error signal output means for providing an error signal when determination is made by said determination means that the distance does not conform to the corresponding design reference value.

2. The design verification device according to claim 1, wherein said diagram data comprises two dimensional diagram data.

3. The design verification device according to claim 2, wherein either of said distance or said design reference value of the corner portion where the sides of a diagram intersect is processed as an elliptical arc.

4. The design verification device according to claim 2, wherein said diagram data comprises diagram data in a plan design drawing of a semiconductor integrated circuit.

5. The design verification device according to claim 1, wherein said diagram data comprises three dimensional diagram data.

6. The design verification device according to claim 5, wherein either said distance or said design reference value in the corner portion where the faces of a diagram intersect is processed as an elliptical curved surface.

7. The design verification device according to claim 1, wherein said different intersecting directions are orthogonal to each other.

8. A design verification device for making determination whether the design is carried out according to a previously set design reference value by calculating the distance of a straight line between boundaries of design diagram data in a physical space, said design verification device comprising:

diagram data memory means for storing design diagram data, an error determination boundary surrounding a design diagram data, design reference value memory means for storing design reference values, determination means for making determination whether said distance conforms to the corresponding design reference value indicating that the design diagram data does not transgress the error determination boundary, and error signal output means for providing an error signal when determination is made by said determination means that the design reference value is not followed, wherein said error determination boundary comprises i. a continuous closed curved line consisting of a straight line and elliptical arc for two dimensional design diagram data, and ii. a continuous closed curved surface consisting of a plane and elliptic surface for three dimensional design diagram data.

* * * * *